United States Patent [19]
Fowler et al.

[11] Patent Number: 4,811,077
[45] Date of Patent: Mar. 7, 1989

[54] COMPOUND SEMICONDUCTOR SURFACE TERMINATION

[75] Inventors: Alan B. Fowler, Yorktown Heights; John L. Freeouf, Katonah; Peter D. Kirchner, Putnam Valley; Alan C. Warren, Peekskill; Jerry M. Woodall, Katonah, all of N.Y.

[73] Assignee: International Business Machines Corporation, Armonk, N.Y.

[21] Appl. No.: 64,414

[22] Filed: Jun. 18, 1987

[51] Int. Cl.⁴ .......................................... H01L 29/34
[52] U.S. Cl. ...................................... 357/52; 357/16; 357/23.2; 357/4; 428/620
[58] Field of Search ...................... 357/52, 16, 23.2, 4; 428/620

[56] References Cited

U.S. PATENT DOCUMENTS 4,354,198 10/1982 Hodgson et al. ...................... 357/16

OTHER PUBLICATIONS

Applied Physics Letters, Jul. 1987, "Nearly Ideal Electronic Properties of Sulfide Coated GaAs Surfaces" by Yablonovitch et al.
U.S. Ser. No. 06/874,738, filed 06/16/86, Kirchner et al.
Applied Physics Letters, Jul. 1987, "Dramatic Enhancement in the Gain of a GaAs/AlGaAs Heterostructure Bipolar Transistor by Surface Chemical Passivation" by Sandroff et al.
J. Vac. Sci. Technol., 17(5), Sep./Oct. 1980, p. 1134, "Effects of $H_2S$ Adsorption on Surface Properties of GaAs [100] Grown in Situ by MBE" by Massies et al.
J. Vac. Sci. Technol. B3 (4), Jul./Aug. 1985, p. 1197, "Influence of S and Se on the Schottky–Barrier Height and Interface Chemistry of Au Contacts to GaAs" by J. R. Waldrop.

Primary Examiner—Andrew J. James
Assistant Examiner—Sara W. Crane
Attorney, Agent, or Firm—Alvin J. Riddles; Thomas J. Kilgannon, Jr.

[57] ABSTRACT

A surface termination of a compound semiconductor is provided wherein conditions are provided for a pristine surface to be retained in an unpinned condition and a surface layer of a non-metallic material is provided. A GaAs substrate is heated in an oxygen-free atmosphere at high temperature with hydrogen sulfide, producing a pristine surface with a coating of gallium sulfide covered with a 1,000 nanometer covering of low temperature plasma enhanced chemical vapor deposited silicon dioxide.

10 Claims, 3 Drawing Sheets

COMPOUND SEMICONDUCTOR SURFACE TERMINATION

DESCRIPTION

1. Technical Field

The invention relates to semiconductor devices fabricated of compound semiconductor materials and to the surfaces of those semiconductor materials that influence the fabrication of devices.

The design and operation of compound semiconductor devices are influenced by a number of factors, a principal one being the properties of the exposed semiconductor surface and of interfaces between the semiconductor crystal and metals or insulators.

In such compound semiconductor devices, on the surface of the semiconductor crystal, the Fermi level is pinned at some characteristic energy and this produces the undesirable effect of both carrier recombination at the surface and an inherent barrier. The development of a number of otherwise possible and useful devices and device structures have been prevented by these conditions and a more nearly ideal interface, that is one whose Fermi level may be moved freely and has low recombination velocity is required.

2. Background Art

There has been effort directed to the problem. The effort usually is called passivation and the result is the providing of a covering member over the compound semiconductor crystal surface.

The work in the art indicates responsiveness to the presence of the element sulfur.

In U.S. Pat. No. 4,354,198, it is taught that on a Group III-V compound semiconductor, such as GaAs, a Group II-VI semiconductor operates to passivate the surface, with the preferred Group II-VI compound being ZnS.

Further work indicates a need for care in the field. In an article in the Journal of Vacuum Science & Technology, Volume 17, No. 5, p.1134, Sept./Oct. 1980, there is described the fact that exposure of GaAs to $H_2S$ in vacuum unpins the Fermi level and that this effect persists after the adding of Al. In another article in the Journal of Vacuum Science & Technology, Vol. B3, No. 4, July/Aug. 1985, p.1197, studies and data indicate the fact that for GaAs, arsenic must be removed or the results become unpredictable. In yet another article, in the Journal of Vacuum Science and Technology, Vol. 19, 1981, p.794, it is shown that native oxides of Ga and As which form in the presence of O are associated with Fermi level pinning. Thus, O behaves in a detrimental way. The use of sulfur compounds to passivate Group III-V compound semiconductors has been reported Applied Physics Letters, July 1987, wherein data is advanced that lithium sulfide, ammonium sulfide and sodium sulfide provide improvement in the GaAs surface recombination property.

The sulfur compound type further passivation work is reported in Applied Physics Letters, July 1987, describing the use of sodium sulfide in an aqueous solution applied at surface electrode locations to provide passivation.

DISCLOSURE OF THE INVENTION

Figure 1:
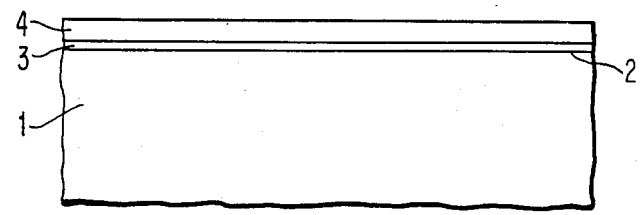
FIG. 1 is a schematic view of a compound semiconductor crystal illustrating a surface with the elements of the invention.

The invention provides a surface termination capability for a variety of compound semiconductor device structures in which there is recognized that there are several interdependent factors that are responsible and that useful termination properties include compatibility with the device being fabricated.

The invention structurally employs a very thin Fermi level pinning control layer of a material that unpins the Fermi level of the compound semiconductor material at the surface. This layer should be on the order of a monolayer in thickness. A monolayer layer of a material may be defined as one surface atom for each surface atom of the material on which it is positioned. The quantity needed for coverage is sensitive to crystallographic orientation. For compatibility with device fabricating the pinning control layer would preferably be thin enough not to attenuate light and permit tunneling for ohmic contact performance. A quantum mechanical tunneling thickness of the order of 20 Å would be satisfactory. The term pristine crystal surface refers to a damage-free uncontaminated crystal surface. The layer of unpinning material is covered with a second layer of a non-metallic material. The non-metallic material is selected for dielectric, ambient reaction inertness and translucence properties.

The resulting compound semiconductor crystal with the surface termination structure of the invention can serve as an intermediate manufacturing product in the fabrication of compound semiconductor devices.

The factors influencing the surface problem may be viewed in the light of the following principles. In order to facilitate communication, the III-V compound GaAs has been selected for illustration although in the light of the principles involved, translation to other semiconductor materials will be readily apparent.

The first factor is that there exists at a compound semiconductor surface an agent responsible for moving the Fermi level away from the normal which is the position in the absence of any surface charge and producing the phenomenon in the art known as Fermi level pinning. In the case of GaAs, this agent appears to be an excess of one or more of the components of the compound semiconductor crystal. In view of this, surface termination for practical device purposes will require the removal of any such agent at that surface. The semiconductor surface is to be pristine.

A second factor is that the compound semiconductor surface will react with the ambient and become contaminated unless steps are taken by protecting with a coating of material that insures that the Fermi level remain in an unpinned condition both on the shelf and in conditions of use, such as in the presence of the materials at the device interface.

The third factor is that generally materials that will control the pinning condition must be able to be compatible with other functional purposes in device fabrication and there may be conditions of material properties and layer thickness incompatibility. In accordance with the invention where such conditions are encountered, a layer is applied to provide the required properties.

The resulting multilayer termination structure of the invention is capable of being employed in a variety of compound semiconductor device structures because the elimination of the Fermi level pinning condition enables the formation of ideal interfaces where barrier height to conduction is no longer constant but depends on the relative work functions of the materials. This in turn provides the ability to selectably form such interfaces as ohmic contacts, selectable barrier height rectifying contacts, and selectable threshold inversion channel carrier control in devices.

Referring to FIG. 1, on a compound semiconductor substrate 1, at a pristine surface 2, that is at a surface 2 where there is essentially no damage and essentially no extraneous material, there will be no pinning agent species, a layer of material that retains the Fermi level in the normal position is applied. The layer for device fabrication and performance compatibility is a very thin, of the order of a monolayer in thickness layer of a material 3 for coverage and is preferably for tunneling purposes of less than tunneling thickness.

Over the layer 3, a layer 4 is provided. The layer 4 is selected to provide dielectric, ambient reaction inertness and translucence properties. It is non-metallic and may be a semiconductor or an insulator.

In accordance with the invention, the compound semiconductor may be a compound of Ga, Al or In with As or Sb or ternary and quaternary alloys thereof.

The layer 3 is a compound of a cation ingredient with respect to the compound semiconductor together with one of S, Se and Te. In a compound semiconductor, the element of the lower group of the periodic table is the cationic ingredient. For one example, a compound of Ga with S. For another example, the layer 3 can be a cation oxide such as $Ga_2O_3$ for a GaAs crystal, if the anion oxide which for GaAs would be $As_2O_3$ plus any excess anion such as As are removed before or during formation of the unpinning layer.

The layer 4 is non-metallic and may be such materials as low temperature plasma enhanced $SiO_2$, $CaF_2$, NaS, ZnS, GaP, GaSe and polyimides.

In the fabrication of the invention, the substrate 1 may be rendered pristine and free of the pinning producing species in, as examples, the following ways, using GaAs as the example:

by heating the crystal with an arsenic coating at about 400° C. for about 10 seconds in vacuum. This procedure produces a surface reconstruction such that the surface unit cell is equivalent to the bulk unit cell and removes the cause of the Fermi level pinning;

by treatment with zinc selenide in a beam that tends to strip the arsenic from the surface;

by exposure to an ambient of hydrogen sulfide at high temperatures;

by the etching of the surface with acids and bases; and by photo-washing under conditions where the crystal surface is subjected to water in the presence of light.

All of these operations provide a compound semiconductor crystal with pristine surface that does not have any of the pinning causing species thereon. Such a surface requires protection so that in accordance with the invention a very thin material that will retain the Fermi level in the free position is applied. This material is a compound of the cation of the compound semiconductor crystal and is a member taken from the group of S, Se and Te, which for GaAs is gallium sulfide, gallium selenide and gallium telluride.

Th application of the layer 4 may employ such techniques as exposing the crystal 1 in FIG. 1 with the layer 3 in place to an ambient of $H_2S$, to an evaporation of sodium sulfide, gallium sulfide or gallium selenide, and by the technique of photo-washing.

The technique of photo-washing is described in patent application Ser. No. 874,738 filed June 16, 1986. The surface produced by that technique may be used as the structure of FIG. 1 on which the layer 4 is to be applied.

The layer 4 is then applied in a thickness of up to approximately 1,000 nanometers.

The surface termination of the invention is useful in a variety of device structures.

Figure 2:
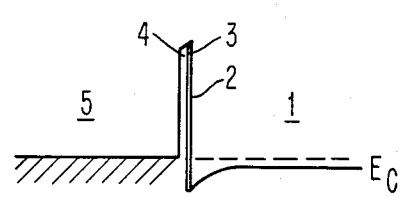
FIG. 2 is an illustration of a band diagram of a tunneling type contact achievable with the invention.

Referring next to FIG. 2, there is shown a band energy diagram illustrating an interface suitable for ohmic contact performance where the layer 3 at the pristine surface 2 results in the Fermi level $E_f$ being unpinned at the surface 2 and the dielectric layer 4 is made sufficiently thin to permit quantum mechanical tunneling so that a contact through a low work function metal, such as In for the metal 5 will demonstrate on a GaAs crystal essentially ohmic conduction performance. The layer 3 being of a monolayer order is thin enough not to interfere with the tunneling mechanism and the layer 4 is of the proper thickness which for most applications is of the order of 20 Angstroms generally achieved in connection with the positioning of the metal contact 5.

In the fabricating of different types of device structures, it is desirable to have a barrier to electrical conduction that is selectable. The selectability provides controllable performance rectifying contacts and the ability to control carrier flow in an inversion channel in a device.

Figure 3:
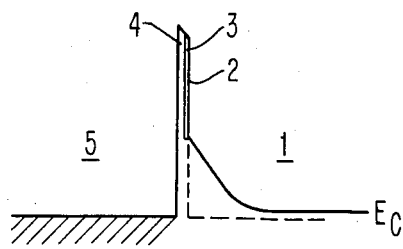
FIG. 3 is an illustration of a variable barrier height contact achievable with the invention.

Referring next to FIG. 3, a band energy diagram is shown where the layer 4 is sufficiently thin to permit quantum mechanical tunneling so that when a higher work function metal, such as Au is used for the metal 5, the performance is that of a selectable Schottky barrier height. This is useful in threshold control of field effect transistors.

In FIGS. 4 through 8, the application of the invention to various types of semiconductor structures is illustrated.

Figure 4:
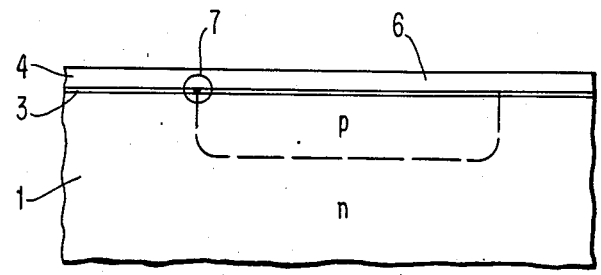
FIG. 4 is an illustration of passivation in a planar structure where a p-n junction is at the surface.

Referring next to FIG. 4, there is illustrated a device wherein there is a p-n junction 6 that terminates at the surface. Where such a structural condition occurs, the carrier recombination is aggravated by the presence of very high fields illustrated at one intersection as element 7. In accordance with the invention, the layers 3 and 4 under these conditions operate to prevent both carrier recombination and the effects of the field.

Figure 5:
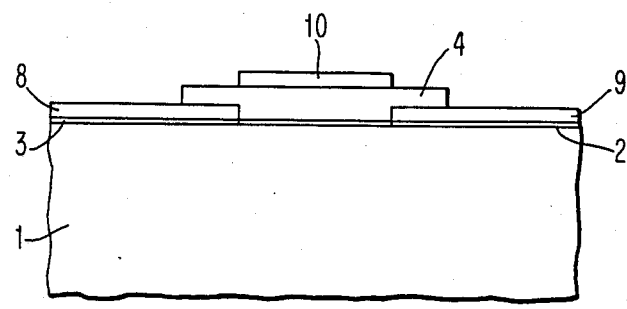
FIG. 5 is a schematic illustration of the application of the invention to a metal oxide semiconductor field effect transistor.

In FIG. 5, a field effect transistor semiconductor device known as a Metal Oxide Semiconductor Field Effect Transistor (MOSFET) is illustrated wherein the semiconductor substrate 1 has positioned thereon source and drain ohmic contacts 8 and 9 that go through the layer 3 on the surface 2 and dielectric layer 4 is in a shape modified to accommodate the other requirements of the device. The thin essentially monolayer thickness of the layer 3 permits the ohmic contacts 8 and 9 to be merely positioned on the layer 3 which in turn doesn't interfere with their electrical performance. The layer 4 serves as the insulator of gate 10 with the layer 4 being provided with appropriate thickness and dielectric strength to have the threshold properties for the inversion of a channel between contacts 8 and 9 at the interface of the crystal 1.

With the structural principles of the invention, it will be readily apparent that the type of selectability of the barrier shown in FIG. 3 provides flexibility in imparting characteristics to a device being fabricated.

Figure 6:
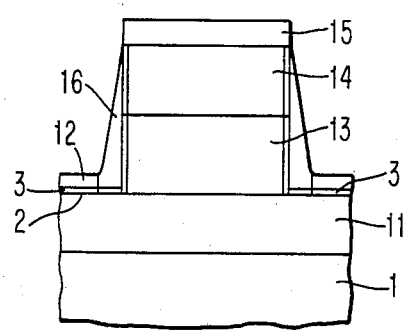
FIG. 6 is a schematic illustration of the application of the invention to the passivation of a bipolar transistor.

Referring next to FIG. 6, a bipolar transistor type structure is illustrated vertically oriented with respect to the substrate wherein the substrate 1, appropriately doped, serves as the collector, with an opposite conductivity type appropriately doped base region 11 positioned adjacent the interface 2. On the layer 3 at interface 2, a circular ohmic electrode 12 is positioned separated from and surrounding a mesa semiconductor region 13 epitaxially joined at the interface 2 serving as the emitter which in turn has a contact facilitating semiconductor region 14 serving as the interface to the metal emitter contact 15.

The features of the invention are employed in this type of structure to facilitate prevention of leakage problems that occur with respect to closely positioned contacts, interfaces terminating at the surface, and ohmic performance. The two layer termination structure on pristine surface of the invention is applied around the emitter 13 shown as element 16. The layer 4 is removed in the positioning of ohmic contact 12 and the layer 3 due to the thin dimension thereof does not affect the ohmic performance of contact 12.

The principles of the invention are further applicable to facilitate construction of electro-optical conversion devices.

Figure 7:
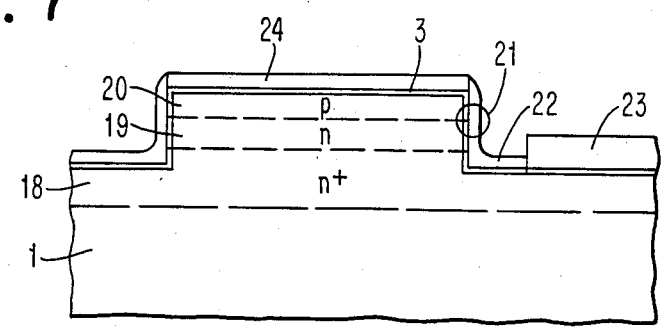
FIG. 7 is a schematic illustration of the application of the invention to the passivation of a light emitting device.

Referring next to FIG. 7, one of the serious problems in the electro-optical conversion field has been the translucent passivation of pn junctions that radiate light.

Referring to FIG. 7, a light emitting diode type device is shown wherein on a substrate 1, there is a high conductivity extrinsic n+ layer 18, an n-type layer 19 and a p-type layer 20 in a mesa type configuration, with the pn junction between elements 19 and 20 serving as the light emitting source in a mesa type configuration. The light emitting junction at the surface is indicated as having a field with the circle at 21. The termination structure of the invention is shown as element 22 applied over the mesa. The ohmic contacts 23 to the n+ region 18 and 24 to the p region 20 are made by removing the layer 4, the ohmic performance being unaffected by the thin layer 3.

In this type of structure, the layers 3 and 4 in the termination of the invention are sufficiently thin not to attenuate the emitted light, yet they serve in passivation and facilitate contacting.

Figure 8:
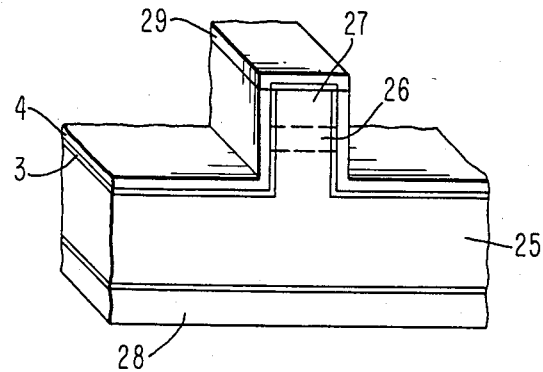
FIG. 8 is a schematic illustration of the application of the invention to the passivation of a semiconductor structure employing a small dimension, quantum wire type feature.

Referring to FIG. 8, a typical, very small, of the order of 50 to 100 Å dimension active region device is shown. Such a device has come to be known in the art as a quantum wire structure. In FIG. 8, on the substrate 25 of a first band gap semiconductor material, such as GaAs, a region 26 of an atomically compatible different band gap high mobility semiconductor, such as InGaAs, is sandwiched between another layer 27 of a different band gap lower mobility semiconductor material such as GaAs in a mesa configuration. In accordance with the invention, the surface at both sides of the mesa and the substrate is coated with the termination structure comprising layer 3 on a pristine surface covered by layer 4.

The termination operates to passivate the surfaces including the hetero-interfaces between different semiconductor materials. Ohmic contacts 28 and 29 are illustrated showing the presence of the layer 3 which due to thickness does not affect ohmic contact performance. The structure of FIG. 8 would have a contact to the quantum wire region 26, not shown.

BEST MODE FOR CARRYING OUT THE INVENTION

The preferred embodiment for fabrication of the structure of FIG. 1 would employ a GaAs crystal 1 which is heated with surface 2 exposed in an oxygen-free atmosphere in $H_2S$ at 700° C. for 30 seconds to render the surface 2 pristine and forms a thin, of the order of a monolayer, coating 3 of gallium sulfide. The GaS coated structure is then provided with a 1–1,000 nanometer dielectric coating 4 of low temperature plasma enhanced chemical vapor deposited silicon dioxide.

What has been described is the fact that surface termination of compound semiconductor material for device use involves insuring the absence of an agent that causes the pinning, the presence of a material that prevents the pinning, and the protection of that material with a non-metallic layer that provides capability for dielectric, ambient reaction inertness and translucence properties.

Having thus described our invention, what we claim as new and desire to secure by Letters Patent is:

1. A compound semiconductor crystal intermediate manufacturing product comprising in combination a monocrystalline compound semiconductor substrate taken from the group of Ga or Al or In and As or Sb and monocrystalline ternary and quaternary alloys thereof having an unpinned Fermi level at the surface thereof,
   means for retaining said Fermi level in the unpinned condition including a layer of only a cation ingredient of said compound semiconductor and a member taken from the group of S, Se and Te in a thickness compatible with electrical current conduction through said layer, and
   a surface layer of a non-metallic material.

2. The intermediate manufacturing product of claim 1 wherein said compound semiconductor crystal is GaAs and said Fermi level pinning control layer is a Ga compound.

3. The intermediate manufacturing product of claim 1 wherein said non-metallic material is taken from the group of $SiO_2$, $CaF_2$, NaS, ZnS, GaP, GaSe and polyimides.

4. The intermediate manufacturing product of claim 2 wherein said non-metallic material is taken from the group of $SiO_2$, $CaF_2$, NaS, ZnS, GaP, GaSe and polyimides.

5. The intermediate manufacturing product of claim 1 wherein said means for retaining said Fermi level layer thickness is in a range of one monolayer to approximately 20 Angstroms.

6. The intermediate manufacturing product of claim 4 wherein said means for retaining said Fermi level layer thickness is in a range of the order of one monolayer to approximately 20 Angstroms.

7. The intermediate manufacturing product of claim 1 where the surface layer is in the range of 1 to 1000 nanometers thick.

8. The intermediate manufacturing product of claim 4 where the surface layer is in the range of 1 to 1000 nanometers thick.

9. The intermediate manufacturing product of claim 5 where the surface layer is in the range of 1 to 1000 nanometers thick.

10. The intermediate manufacturing product of claim 6 where the surface layer is in the range of 1 to 1000 nanometers thick.

* * * * *